United States Patent
Xiong et al.

(10) Patent No.: US 8,957,410 B2
(45) Date of Patent: Feb. 17, 2015

(54) ORGANIC LIGHT-EMITTING DIODE PACKAGE STRUCTURE AND METHOD FOR FORMING THE SAME

(71) Applicant: Shanghai Tianma Micro-Electronics Co., Ltd., Shanghai (CN)

(72) Inventors: Zhiyong Xiong, Shanghai (CN); Bengang Zhao, Shanghai (CN); Xiaojun Ma, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/898,306

(22) Filed: May 20, 2013

(65) Prior Publication Data
US 2014/0175389 A1 Jun. 26, 2014

(30) Foreign Application Priority Data
Dec. 24, 2012 (CN) .......................... 2012 1 0567658

(51) Int. Cl.
*H01L 51/52* (2006.01)
*H01L 51/56* (2006.01)

(52) U.S. Cl.
CPC .......... *H01L 51/524* (2013.01); *H01L 51/5246* (2013.01); *H01L 51/56* (2013.01); *H01L 51/525* (2013.01); *H01L 2251/558* (2013.01); *H01L 2251/566* (2013.01)
USPC ................................ 257/40; 257/99; 438/26

(58) Field of Classification Search
CPC . H01L 51/5246; H01L 51/56; H01L 51/5237; H01L 27/3244; H01L 27/32; H01L 51/525; H01L 51/524
USPC .......... 257/40, 79, 99, 100, 59, 72, 81, 88, 98
See application file for complete search history.

(56) References Cited

U.S. PATENT DOCUMENTS

2007/0164672 A1 7/2007 Omura et al.
2009/0315458 A1* 12/2009 Choi et al. .................... 313/505

FOREIGN PATENT DOCUMENTS

| EP | 2139041 A1 | 12/2009 |
| JP | 2010 228998 A | 10/2010 |
| JP | 2010 257830 A | 11/2010 |
| JP | 2011 029081 A | 2/2011 |
| KR | 2008 0101146 A | 11/2008 |
| KR | 20090069497 A | 7/2009 |

OTHER PUBLICATIONS

KR20080101146 translation.*
Extended European Search Report issued Dec. 4, 2013 in European Application No. 13165093.9.

* cited by examiner

*Primary Examiner* — Whitney T Moore
(74) *Attorney, Agent, or Firm* — Kilpatrick Townsend & Stockton LLP

(57) ABSTRACT

An OLED package structure includes: a substrate, on which an organic light-emitting element is provided, and a cover plate having an annular groove surrounding the organic light-emitting element thereon. A packaging adhesive, partly inside the groove and partly outside the groove, adheres the cover plate to the substrate to seal the organic light-emitting element. In the OLED package structure according to the present invention, the thickness of the spacer can be smaller, so as to eliminate color mixture during an evaporation process and to prevent a Newton ring phenomenon in the OLED package structure.

17 Claims, 3 Drawing Sheets

ORGANIC LIGHT-EMITTING DIODE PACKAGE STRUCTURE AND METHOD FOR FORMING THE SAME

CROSS-REFERENCES TO RELATED APPLICATIONS

This application claims priority to Chinese patent application No. 201210567658.1 titled "ORGANIC LIGHT-EMITTING DIODE PACKAGE STRUCTURE AND METHOD FOR FORMING THE SAME" and filed with State Intellectual Property Office of PRC on Dec. 24, 2012, which is incorporated herein by reference in its entirety.

FIELD OF THE INVENTION

The present invention relates to display technology, and in particular to an organic light-emitting diode package structure and a method for forming the same.

BACKGROUND OF THE INVENTION

Organic light-emitting diode (OLED) display, which is also referred to as organic electroluminescence display (OELD), is a most promising display technology due to its advantages such as good color contrast, active light-emitting, wide viewing angle, thinness, fast response speed and low power consumption. However, in an OLED device, it is possible for an organic light-emitting layer and an electrode to fail if they encounter with water or oxygen. Accordingly, thereby service life of the OLED device is affected greatly. Thus the OLED device generally needs to be well sealed. In an early packaging method, since it has been impossible to ensure a good sealing, typically a desiccant or drier sheet has been provided inside the OLED device. However, it has been unnecessary to use the desiccant or drier sheet inside the OLED device since frit sealing has been used as a packaging adhesive, as the frit is heated and melted by using a moving laser beam and can form a seal structure with good air-tightness.

However, there is a new problem for the OLED package structure using a frit as the packaging adhesive.

As shown in FIG. 1, an OLED package structure 100 using the frit as the packaging adhesive includes a substrate 110, a cover plate 120 and a frit packaging adhesive 130. An organic light-emitting element 111 is formed on the substrate 110. Typically, there is a spacer 112 inside the package structure for keeping a uniform distance between the substrate 110 and the cover plate 120 of the OLED.

Generally, the spacer should not be too thick. This is because, as shown in FIG. 2, evaporation is needed during the manufacture of the OLED. During the evaporation, a mask 240 is typically used for protection, and an organic film layer 213 (and an inorganic film layer) is formed on the substrate through an opening of the mask 240 by the evaporation. During the evaporation process, the mask 240 contacts the spacer 212. Thus, if the spacer 212 is too thick, unwanted evaporation material develops on the left side and the right side of the organic film layer 213. The unwanted evaporation material may cause poor display quality, such as poor color mixture of the display device.

Therefore, it is typically required to manufacture a thinner spacer. Moreover, the frit used as the packaging adhesive is also required to be thinner. This is because, as shown in FIG. 3, if the thickness of the frit 330 is not reduced, the frit 330 on the left side and the right side of the OLED package structure 300 is thicker and the spacers 312 in the middle are thinner, the cover plate 320 may be warped. In this case, a Newton ring effect which affects image quality of the finally formed display device may be generated between the cover plate 320 and the substrate 310. However, the frit 330 has to be sufficiently thick to ensure packaging requirements.

BRIEF SUMMARY OF THE INVENTION

One implementation is an organic light-emitting diode package structure, including a substrate, on which an organic light-emitting element is provided, and a cover plate including an annular groove along a periphery of an inner surface of the cover plate, where the annular groove surrounds the organic light-emitting element. The organic light-emitting diode package structure also includes a packaging adhesive having a thickness greater than a depth of the groove, where a portion of the packaging adhesive is located inside the groove of the cover plate, a portion of the packaging adhesive extends outside the groove of the cover plate, and the cover plate and the substrate are adhered to each other by the packaging adhesive, so as to seal the organic light-emitting element.

Another implementation is a method for forming an organic light-emitting diode package structure. The method includes providing an entire substrate having a plurality of substrate units, each substrate unit including an organic light-emitting element. The method also includes providing an entire cover plate having a plurality of cover plate units, each cover plate unit including an annular groove surrounding the organic light-emitting element thereon, and forming a packaging adhesive in the groove of each of the cover plate units, where a portion of the packaging adhesive is located inside the groove of each of the cover plate units and a portion of the packaging adhesive extends outside the groove of each of the cover plate units. The method also includes pressing the entire cover plate and the entire substrate together, where the cover plate units our adhered to the substrate units with the packaging adhesive to seal each organic light-emitting element, and cutting the adhered entire cover plate and entire substrate to obtain a plurality of organic light-emitting diode package structures.

DETAILED DESCRIPTION OF THE INVENTION

A First Embodiment

Figure 1:
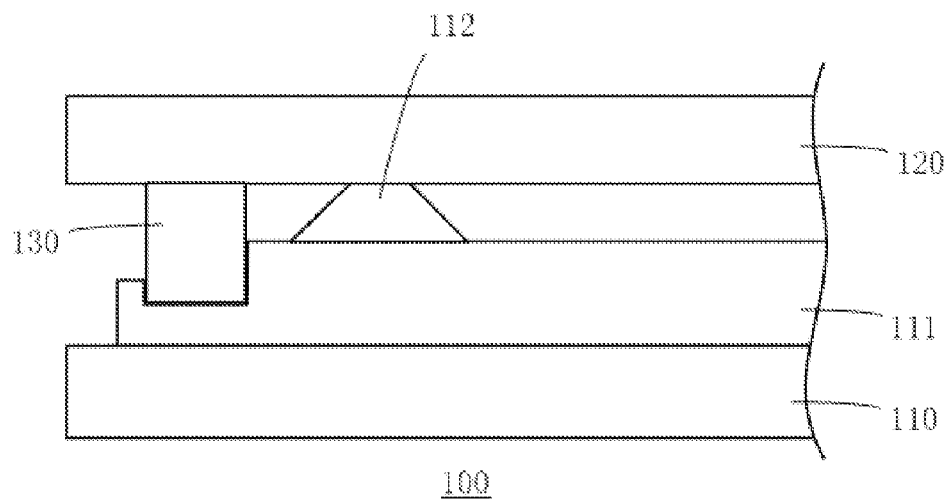
FIG. 1 is a schematic diagram illustrating an existing OLED package structure using frit as a packaging adhesive.
Figure 2:
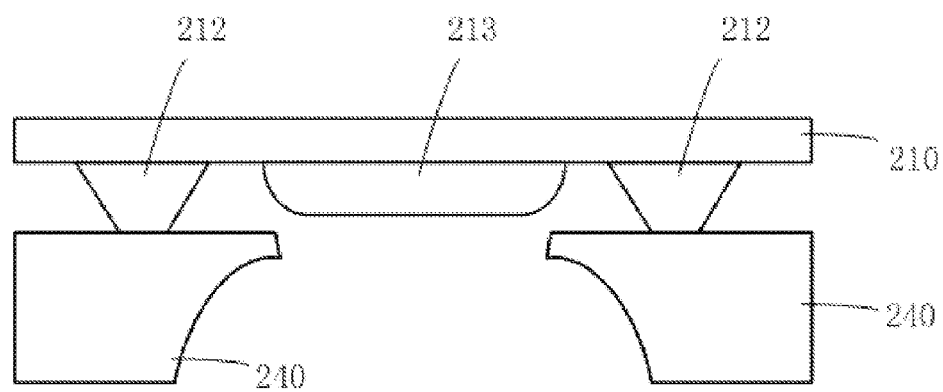
FIG. 2 is a schematic diagram illustrating the OLED package structure illustrated in FIG. 1 during an evaporation process.
Figure 3:
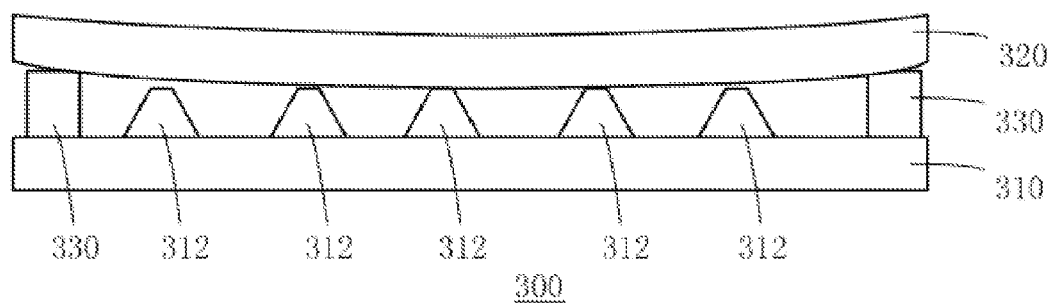
FIG. 3 is a schematic diagram illustrating an existing OLED package structure in which a Newton ring occurs.
Figure 4:
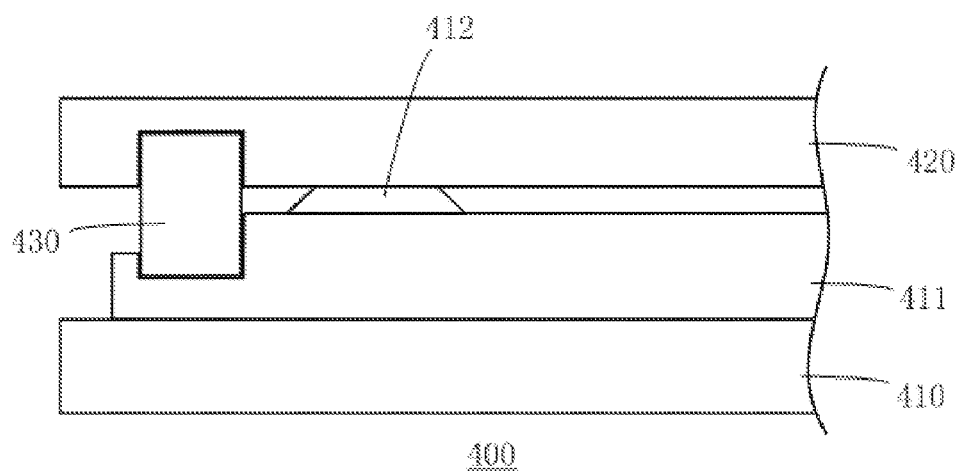
FIG. 4 is a schematic diagram illustrating an OLED package structure according to an embodiment of the present invention.

As shown in FIG. 4, an OLED package structure 400 according to an embodiment is shown. The OLED package structure 400 includes a substrate 410, a cover plate 420 and a packaging adhesive 430. On the substrate 410, an organic light-emitting element 411 including an OLED (not shown in the Figure) is provided. An annular groove is on the periphery of the inner surface of the cover plate 420 and surrounds the organic light-emitting element 411. As shown, the groove is located where the packaging adhesive 430 extends into the cover plate 420. The thickness of the packaging adhesive 430 is greater than the depth of the groove, so that a portion of the packaging adhesive 430 is in the groove of the cover plate 420, and a portion of the packaging adhesive 430 extends outside the groove of the cover plate 420. The cover plate 420 and the substrate 410 are adhered to each other by the packaging adhesive 430, so as to seal the organic light-emitting element 411.

It should be noted that, in other embodiments according to the present invention, multiple grooves may also be similarly used. The frit is filled in each of the grooves, and the adhering is performed, so that the effect of sealing and adhering between the cover plate 420 and the substrate 410 is improved.

In some embodiments, multiple spacers 412 (only one is shown in FIG. 4) are provided between the organic light-emitting element 411 and the cover plate 420. In the OLED package structure 400 according to the embodiment shown, a portion of the packaging adhesive 430 is fixed in the groove of the cover plate 420. Therefore, the distance between the cover plate 420 and the substrate 410 adhered with the packaging adhesive 430 can be reduced with the packaging being not affected, and thus the thickness of the spacer 412 may be smaller. Since the thickness of the spacers 412 is smaller, evaporated materials at undesirable places may be reduced or eliminated. Accordingly, a color mixture phenomenon is prevented from occurring in the OLED package structure 400. Moreover, since the thickness of the spacers 412 is equal to the distance between the cover plate 420 and the substrate 410, in this case the spacers 412 may ensure a uniform distance between the cover plate 420 and the substrate 410, so that the Newton ring phenomenon is prevented form occurring in the entire OLED package structure 400.

In some embodiments, the thickness of the spacer is typically above 2.5 μm. However, in other embodiments, the thickness of the spacer 412 is much smaller and may be below about 2.0 μm. For example, the thickness of the spacer may be about 1.5 μm or about 1.0 μm.

In the embodiment, the substrate 410 may be either a transparent substrate 410 or a semitransparent or nontransparent substrate 410. In some embodiments, the substrate 410 is a glass substrate 410.

The cover plate 420 may be transparent. The cover plate 420 may be made of a glass material or a plastic material. In order to be used with the packaging adhesive 430, the depth of the may be between about 1 μm and about 4 μm, and the width thereof may be between about 0.8 μm and about 2 μm.

The packaging adhesive 430 may be frit. The frit can not be manufactured because the frit can not have a good sealing and adhering effect if to thin. The thickness of the frit may be between about 5 μm and about 9 μm. With a thickness in such a range, a portion of the frit may extend into the groove of the cover plate 420 and another portion of the frit is exposed outside the groove to adhere to the substrate 410. It should be noted that, other packaging adhesives which are capable of ensuring good sealing for the OLED package structure 400 may also be applicable in other embodiments according to the present invention.

The OLED may be an active matrix OLED and the organic light-emitting element 411 may be an active matrix organic light-emitting element 411. Thus the formed OLED package structure 400 may be an active matrix OLED package structure.

A Second Embodiment

A method for forming an OLED package structure, including Step S1 to Step S5 is described below. It should be noted that, in the method, the steps are named as S1 to S5 for distinguishing the steps conveniently and not for limiting the sequencing of the steps. In different embodiments according to the present invention, the sequencing of the steps may be adjusted. Steps S1 to S5 are described in conjunction with FIG. 4 to FIG. 7. The OLED package structure 400 as shown in FIG. 4 is formed with Steps S1 to S5 (corresponding to structures shown in FIG. 5 to FIG. 7) in the embodiment.

In Step S1, an entire substrate including multiple substrate units is provided. Each substrate unit includes an organic light-emitting element.

Figure 5:
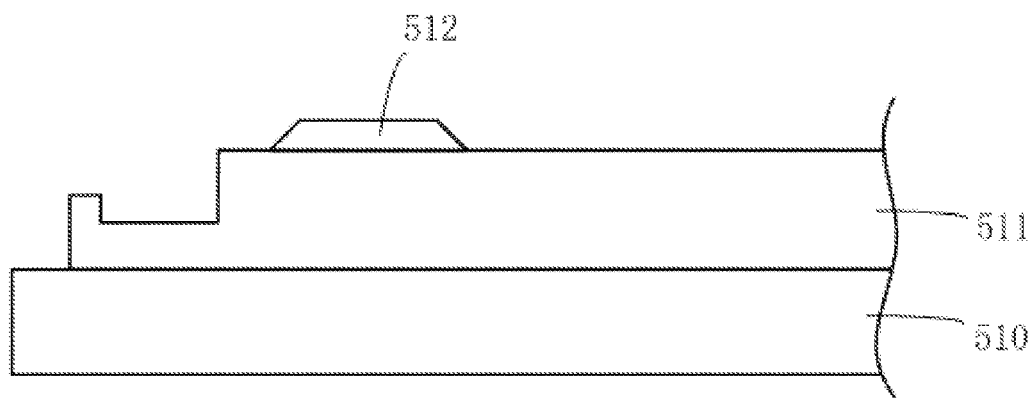
FIG. 5 to FIG. 7 are schematic diagrams illustrating structures corresponding to steps in a method for forming an OLED package structure according to an embodiment of the present invention.

With reference to FIG. 5, the entire substrate 510 includes multiple substrate units. As shown in FIG. 5, in this embodiment, only a portion of one substrate unit of the entire substrate 510 is shown for convenience of illustration. On the substrate unit, an organic light-emitting element 511 including an OLED is provided. Various processes for forming the organic light-emitting element 511 on the entire substrate 510 are known and are not described herein.

Still referring to FIG. 5, a spacer 512 is provided on the organic light-emitting element 511 and the thickness of the spacer 512 is much less than that in conventional displays, and may be less than 2.0 μm. In some embodiments, the thickness of the spacer 512 may be only about 1.5 μm or about 1.0 μm.

In Step S2, an entire cover plate is provided. The entire cover plate includes multiple cover plate units. One or more annular grooves are formed in the inner surface of each of the cover plate units to surround the organic light-emitting element.

Figure 6:
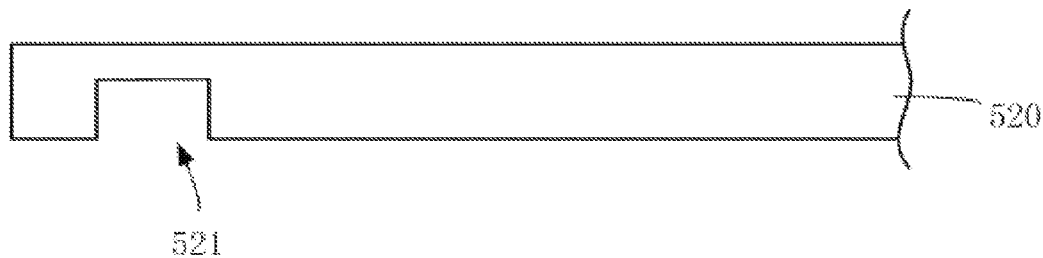

In the shown embodiment, the entire cover plate 520 (referring to FIG. 6) corresponding to the entire substrate 510 is provided. The entire cover plate 520 includes multiple cover plate units. Similarly, as shown in FIG. 6, only a portion of one cover plate unit of the entire cover plate 520 is shown for convenience of illustration. The cover plate unit matches and aligns with the substrate unit. Accordingly, each cover plate unit covers one substrate unit. An annular groove 521 is provided in the inner surface of each of the cover plate units surrounding the organic light-emitting element. It should be noted that, in other embodiments of the invention, multiple annular grooves may be used.

The entire cover plate 520 may be a transparent cover plate. In some embodiments, the entire cover plate 520 is made of a glass material or a plastic material. The depth of the groove 521 may range from about 1 μm to about 4 μm and the width thereof may range from about 0.8 μm to about 2 μm, so that a portion of a packaging adhesive can fill in the groove 521.

In Step S3, the packaging adhesive is formed in the groove of the cover plate unit. A portion of the packaging adhesive is located inside the groove of the cover plate and a portion of the packaging adhesive extends outside the groove of the cover plate.

Figure 7:
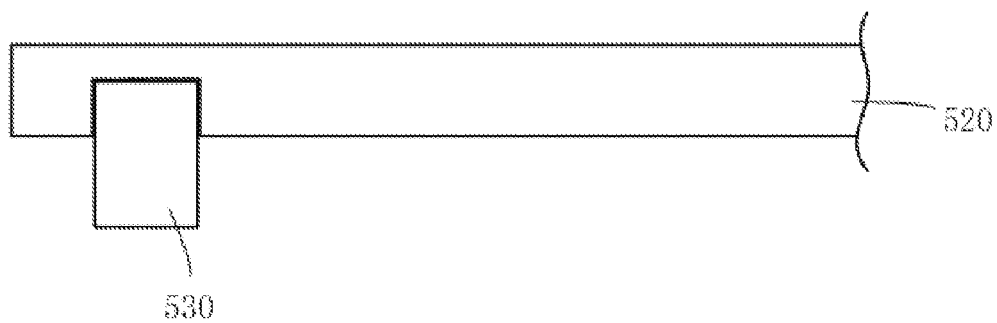

Referring to FIG. 7, the packaging adhesive 530 may be a frit. The frit may be formed in the groove 521 by using, for example, a screen printing process. Moreover, the thickness of the frit packaging adhesive 530 may range from about 5 μm to about 9 μm to fit the size of the groove 521. The depth of the groove 521 may range from about 1 μm to about 4 μm and the width thereof may range from about 0.8 μm to about 2 μm. It should be noted that other packaging adhesives which are capable of ensuring good sealing for the OLED package structure may also be applicable in other embodiments according to the present invention.

In Step S4, the entire cover plate and the entire substrate are pressing together, and the cover plate units are adhered to the substrate units using the packaging adhesive, so as to seal each organic light-emitting element.

In Step S4, multiple seal structure units are formed as a whole. Therefore, the entire cover plate 520 and the entire substrate 510 are pressed together with the cover plate units being adhered to the substrate units using the packaging adhesive 530, and each organic light-emitting element 511 is sealed. Although the formed entire OLED package structure is not shown in the figure, the structure in FIG. 4 may be referred to. FIG. 4 may be regarded as a schematic diagram illustrating a portion of one unit of the OLED package structures formed as a whole. The frit may be melted by laser to adhere the cover plate units with the substrate units.

In Step S5, the adhered entire cover plate and entire substrate are cut, to obtain multiple OLED package structures.

The OLED package structures formed as a whole are cut into individual OLED package structures. The adhered entire cover plate and entire substrate are cut to obtain multiple OLED package structures. For the OLED package structure, the OLED package structure 400 shown in FIG. 4 may be referred to. The OLED may be an active matrix OLED and the organic light-emitting element may be an active matrix organic light-emitting element. Thus, the finally formed OLED package structure may be an active matrix OLED package structure.

The above described characteristics are only specific embodiments of the present invention. However, the scope of protection of the present invention is not limited thereto. Changes may be made to the embodiments by those skilled in the art in light of the spirit of the present invention without deviation from the scope of protection of the present invention.

What is claimed is:

1. An organic light-emitting diode package structure, comprising:
    a substrate comprising an organic light-emitting element;
    a cover plate comprising an annular groove along a periphery of the cover plate, wherein the annular groove surrounds the organic light-emitting element; and
    a packaging adhesive having a thickness greater than a depth of the groove, wherein a portion of the packaging adhesive is located inside the groove of the cover plate, a portion of the packaging adhesive extends outside the groove of the cover plate, and the cover plate and the substrate are adhered to each other by the packaging adhesive, so as to seal the organic light-emitting element,
    wherein a spacer is provided between the organic light-emitting element and the cover plate such that the spacer contacts a surface of the organic light-emitting element and contacts a surface of the cover plate, and wherein a thickness of the spacer is less than about 2 μm, and
    wherein the adhesive extends both into the organic light-emitting element beyond the surface of the organic light-emitting element and into the cover plate beyond the surface of the cover plate.

2. The organic light-emitting diode package structure according to claim 1, wherein the packaging adhesive is frit.

3. The organic light-emitting diode package structure according to claim 2, wherein a thickness of the frit ranges from about 5 μm to about 9 μm.

4. The organic light-emitting diode package structure according to claim 3, wherein the depth of the groove ranges from about 1 μm to about 4 μm and a width of the groove ranges from about 0.8 μm to about 2 μm.

5. The organic light-emitting diode package structure according to claim 1, wherein the cover plate comprises a glass material or a plastic material.

6. The organic light-emitting diode package structure according to claim 1, wherein the organic light-emitting element is an active matrix organic light-emitting diode.

7. A method for forming an organic light-emitting diode package structure, the method comprising:
    providing an entire substrate comprising a plurality of substrate units, each substrate unit comprising an organic light-emitting element;
    providing a spacer having a thickness less than 2.0 μm on each organic light-emitting element;
    pressing a protection mask having an opening against the spacers, and maintaining the opening of the protection mask located between the spacers;
    evaporating an organic material through the opening and onto the substrate to form an organic layer, wherein the organic material forms the organic layer on the substrate in an area of the substrate corresponding with the opening, and wherein the organic material does not form the organic layer on the substrate outside the area of the substrate corresponding with the opening;
    providing an entire cover plate comprising a plurality of cover plate units;
    forming an annular groove in an inner surface of each cover plate unit;
    forming a packaging adhesive in the groove of each of the cover plate units, wherein a portion of the packaging adhesive is located inside the groove of each of the cover plate units and a portion of the packaging adhesive extends outside the groove of each of the cover plate units;
    pressing the entire cover plate and the entire substrate together, wherein the cover plate units are adhered to the substrate units with the packaging adhesive to seal each organic light-emitting element, and the spacer provided on each organic light-emitting element is in contact with the entire cover plate; and
    cutting the adhered entire cover plate and entire substrate to obtain a plurality of organic light-emitting diode package structures.

8. The method for forming the organic light-emitting diode package structure according to claim 7, wherein the packaging adhesive is frit.

9. The method for forming the organic light-emitting diode package structure according to claim 8, wherein the frit is formed in the groove by using a screen printing process.

10. The method for forming the organic light-emitting diode package structure according to claim 9, wherein the frit is melted by laser to adhere the cover plate units with the substrate units.

11. The method for forming the organic light-emitting diode package structure according to claim 10, wherein a thickness of the frit ranges from about 5 μm to about 9 μm.

12. The method for forming the organic light-emitting diode package structure according to claim 7, wherein a depth of the groove ranges from about 1 μm to about 4 μm and a width of the groove ranges from about 0.8 μm to about 2 μm.

13. The method for forming the organic light-emitting diode package structure according to claim 7, wherein the entire cover plate comprises a glass material or a plastic material.

14. The method for forming the organic light-emitting diode package structure according to claim 7, wherein the organic light-emitting diode is an active matrix organic light-emitting diode and the organic light-emitting element is an active matrix organic light-emitting element.

15. An organic light-emitting diode device, comprising:
a substrate comprising an organic light-emitting device;
a cover plate comprising an annular groove; and
a packaging adhesive adhering the cover plate to the substrate so as to form a closed cavity sealing the organic light-emitting device, wherein a portion of the packaging adhesive is located inside the groove of the cover plate, and wherein the annular groove surrounds the organic light-emitting device,
wherein a spacer is provided between the organic light-emitting element and the cover plate such that the spacer contacts a surface of the organic light-emitting element and contacts a surface of the cover plate, and wherein a thickness of the spacer is less than about 2 μm, and
wherein the adhesive extends both into the organic light-emitting element beyond the surface of the organic light-emitting element and into the cover plate beyond the surface of the cover plate.

16. The organic light-emitting diode device according to claim 15, wherein the packaging adhesive is frit.

17. The organic light-emitting diode device according to claim 15, wherein the organic light-emitting device is an active matrix organic light-emitting diode.

\* \* \* \* \*